SELECTIVE DEPOSITION OF SEMICONDUCTOR MATERIALS

Original Filed May 1, 1964 2 Sheets-Sheet 1

James F. Watson
INVENTOR

BY John D. Graham
ATTORNEY

Nov. 5, 1968 J. F. WATSON 3,409,483

SELECTIVE DEPOSITION OF SEMICONDUCTOR MATERIALS

Original Filed May 1, 1964 2 Sheets-Sheet 2

James F. Watson
INVENTOR
BY John D. Graham
ATTORNEY

United States Patent Office 3,409,483
Patented Nov. 5, 1968

3,409,483

SELECTIVE DEPOSITION OF SEMICONDUCTOR MATERIALS

James F. Watson, Richardson, Tex., assignor to Texas Instruments Incorporated, Dallas, Tex., a corporation of Delaware Continuation of application Ser. No. 364,234, May 1, 1964. This application May 26, 1967, Ser. No. 641,704
7 Claims. (Cl. 148—175)

ABSTRACT OF THE DISCLOSURE

A method for depositing small limited area epitaxial regions on a body of semiconductor material. A masking layer such as silicon oxide or magnesium fluoride is used to define a pattern of openings where epitaxial material is to be grown, followed by said epitaxial growth. The masking layer may be removed and the process repeated to create a complex structure without disturbing shallow underlying layers. Specific combinations of steps to obtain specific complex structures are claimed. The application of the process to the fabrication of integrated circuits is disclosed.

This application is a continuation of application Ser. No. 364,234 filed May 1, 1964, and now abandoned.

This invention relates to a method for selectively depositing semiconductor material, and more particularly to a technique for epitaxially growing a limited-area layer of semiconductor upon a substrate of semiconductor material.

In the fabrication of semiconductor devices of complex geometry, regions of desired conductivity types must be formed in or on a monocrystalline semiconductor wafer with a high degree of depth control, conductivity, and lateral extent of the regions. Diffusion techniques using oxide masking, such as illustrated in the patent to Andrus 3,112,817, offer excellent geometrical control and have gained wide acceptance. However, diffusion of impurities does not permit complete control of the impurity concentration, in that the distribution will always follow a certain gradient so that a second or third diffusion must always be of higher concentration than the previous one if the conductivity-type is to be converted. For this reason, epitaxial deposition has been employed in the semiconductor arts to produce surface layers of uniform and controlled impurity concentration. Typically, a transistor or integrated circuit is made by growing an epitaxial layer over an entire face of a semiconductor wafer or slice, and then limiting the active or effective area of the epitaxial layer by mesa etching or isolation diffusion. In some cases, however, especially if multiple thin layers are involved, these two techniques are unsuitable since the depth of the operation cannot be accurately controlled.

It is therefore the principal object of this invention to provide a method of depositing small, limited-area epitaxial regions on a body of semiconductor material. Another object is to provide improved semiconductor devices of the type including epitaxial layers. A further object is to provide a method of masking the deposition of semiconductor materials.

In accordance with this invention, a masking layer is grown or deposited onto a semiconductor surface prior to the epitaxial deposition. This layer is composed of a material, such as silicon oxide, which adheres to the semiconductor surface but to which the subsequently grown seminconductor material will not adhere. The masking layer may define a pattern of openings where epitaxial material is to be grown. A succession of repetitions of the steps of masking, epitaxial growth, and removal of the mask may be used to create a complex structure without disturbing shallow underlying layers.

The novel features believed characteristic of this invention are set forth in the appended claims. The invention itself, as well as other objects and advantages thereof, will best be understood, however, by reference to the following description of illustrative embodiments, when read in conjunction with the accompanying drawings, wherein:

As the term is used in semiconductor technology, epitaxial deposition involves the addition of semiconductor material to a crystalline substrate in such a manner that the crystallographic orientation and periodicity is maintained. As ordinarily practiced, the technique involves a pyrolytic or a pyrolytic-disproportionation type of chemical reaction, generally involving a halogen transport element wherein semiconductor material in the form of a halide compound is caused to decompose on a semiconductor crystal substrate to provide a deposit which retains the orientation and periodicity of the crystalline substrate. Most common perhaps is the deposition of an epitaxial silicon film on a silicon substrate by the hydrogen reduction of silicon tetrachloride. The substrate usually has an interatomic spacing very close to that of the deposited material, and may be of the same or a different semiconductor material. The conductivity type and impurity concentration of the deposited material are controlled by entraining the appropriate materials in the gaseous stream which passes over the substrate. In this manner, N-type silicon may be deposited onto P-type silicon, or onto N-type silicon of a different conductivity, for example, or germanium may be grown upon gallium arsenide. Techniques for epitaxial deposition are illustrated in U.S. Patents 2,692,839, 2,763,581, 3,089,794, and French Patent 1,282,020.

Figure 1:
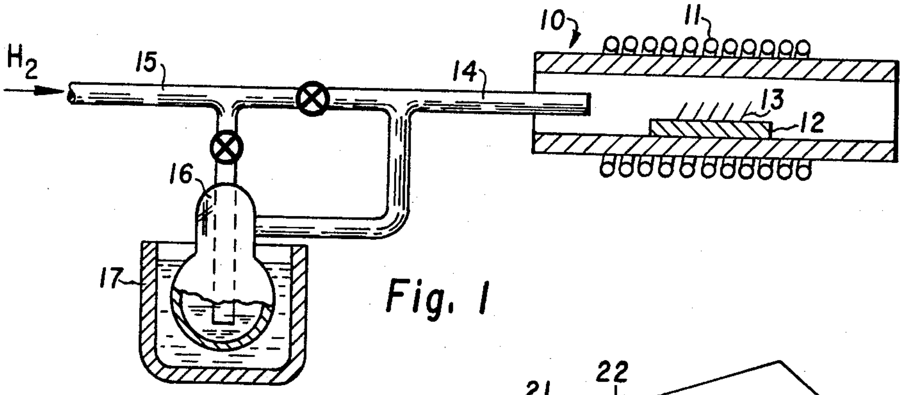
FIGURE 1 is a front elevation, partly in section, of one form of apparatus used for the growth of epitaxial films.

Referring now to FIGURE 1, apparatus for growing epitaxial films as employed in this invention may comprise an epitaxial reactor in the form of a tube furnace 10 having a heating coil 11. A boat 12 holding several silicon slices 13 is disposed within the tube furnace in such a position as to expose the slices to gases directed into the tube from a conduit 14. Purified dried hydrogen enters an end 15 of the conduit. Silicon tetrachloride vapor is introduced into the conduit from a flask 16 of liquid silicon tetrachloride submerged in a reservoir 17 of liquid nitrogen. The vapor pressure of silicon tetrachloride is regulated by the degree of refrigeration of the flask 16 in which the hydrogen gas is saturated. The flow of gases into the tube furnace is regulated by conventional valves. Doping impurities may be introduced into the gas stream by placing the appropriate impurity-containing compound, such as a halide of boron or phosphorus, into the flask 16 or in a similar flask if a different temperature is needed. With the arrangement of FIGURE 1, silicon is deposited upon the slices 13, and grows epitaxially, due to hydrogen reduction of silicon tetrachloride. Of course, other materials and other deposition techniques are equally applicable to this invention.

Figures 2, 3:
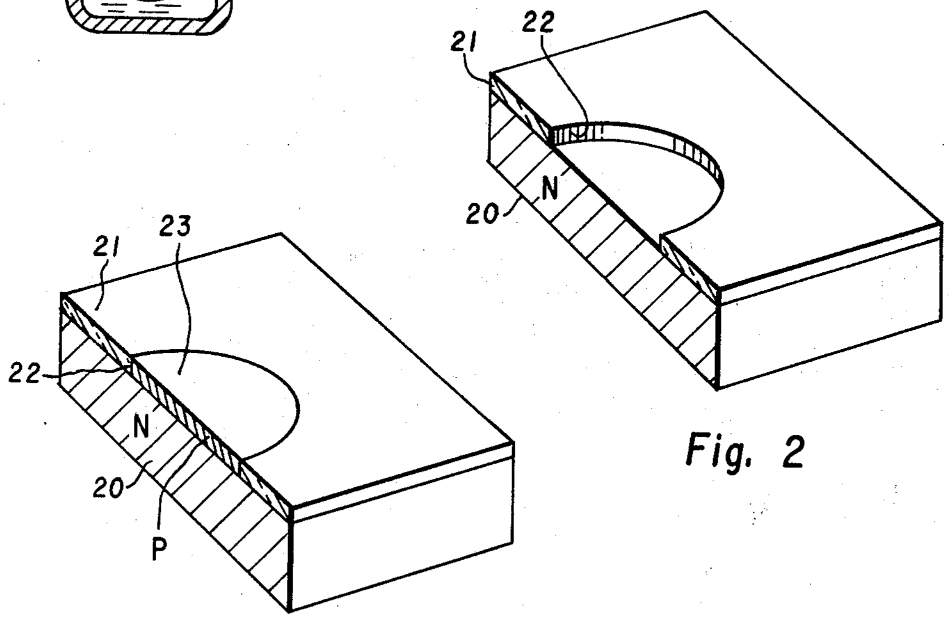
FIGURES 2 through 5 are elevation views in section of a device made according to this invention at various stages of manufacture.
Figure 4:
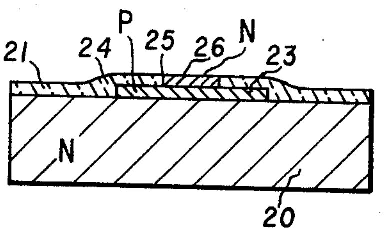
Figure 5:
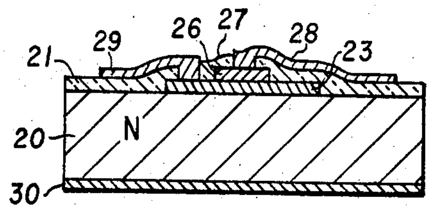

In practicing this invention, the slices 13 in FIGURE 1 would contain a masking pattern to produce the desired epitaxial growth. With reference to FIGURE 2, a wafer 20 of monocrystalline silicon is shown which has a thermally grown silicon oxide coating 21. An opening 22, corresponding to the shape of the desired epitaxial ragion, is cut in the silicon oxide by photoresist masking and etching in accordance with standard practice. This wafer 20 would actually be only a small segment of a silicon slice of perhaps one inch diameter which would contain dozens or hundreds of like elements. The wafer 20 as seen in FIGURE 2, being part of a slice, is placed in the reaction chamber of FIGURE 1 where silicon deposits adhere to the exposed silicon surface in the opening 22 but not to the oxide 21. A limited-area layer 23 may thus be grown, as seen in FIGURE 3, and this layer may be of opposite type conductivity than the substrate; i.e., P-type on N-type. It is noted that the edge of the p-n junction between the region 23 and the substrate 20 is completely enclosed within the silicon oxide, passivating and stabilizing the device. Thereafter, another oxide coating 24 as seen in FIGURE 4 may be grown on the top surface of the wafer over the layer 23 and an opening 25 cut. The slice is placed in the reactor again and an N-type region 26 grown thereon. It is seen here that the small region 26 is provided without the necessity of disturbing the underlying layer 23 with mesa etching or isolation diffusions. Also, very small geometries, measured in mils or tenths of mils, may be obtained by the photographic methods used to define the holes in the oxide. The device of FIGURE 4, an NPN transistor, is completed by growing another oxide layer 27, see FIGURE 5, opening holes for contacts, then depositing metal for the emitter and base contacts 28 and 29, which may be expanded out over the oxide layer as shown. A collector contact 30 is applied to the back of the wafer. The relative thicknesses of the various layers of different materials are not necessarily to scale, the oxide actually being much thinner than the epitaxial layers.

Figure 6:
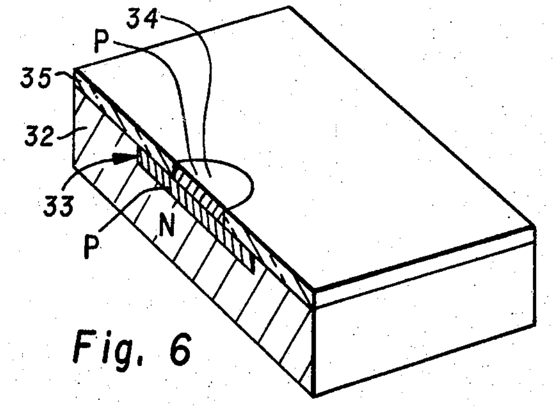
FIGURES 6 through 8 are elevation views in section of another embodiment at various stages in manufacture.
Figure 7:
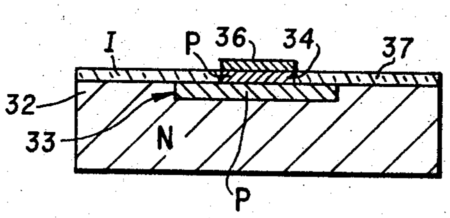
Figure 8:
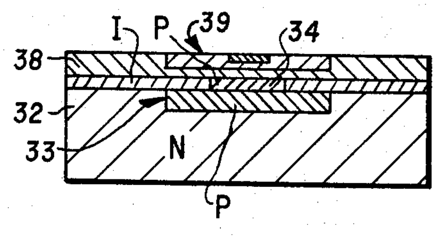

In integrated circuits, where many circuit components may be formed within a monocrystalline body, this invention has great utility because of the great flexibility permitted in determining the conductivity-type, resistance, and even the type of material, in a complex multilevel structure. With reference to FIGURE 6, a wafer 32 has a circuit component such as a diode 33 formed in one face thereof. The techniques of this invention are used to grow an epitaxial P+ region 34 which is masked by an oxide layer 35. The oxide is removed and the layer 34 masked by oxide layer 36 as seen in FIGURE 7. Then high resistivity semiconductor material is epitaxially grown on the peripheral area of the wafer face to provide an intrinsic barrier region 37. This may be composed of intrinsic-appearing, chromium-doped gallium arsenide, for example, whereas the region 34 could be highly conductive germanium. Thereafter, a layer 38 of epitaxial semiconductor could be grown across the entire top of the wafer, then a circuit component such as a transistor 39 formed in the layer. It is seen that the collector of the transistor 39 is connected to the anode of the diode 33 by the completely enclosed region 34 whereas all other portions of the layer 38 are insulated from the substrate 32. Of course, the various layers could have many circuit components therein, and the layers could be built up to produce an extremely complex circuit wherein all interconnections are enclosed within the monocrystalline semiconductor block.

Instead of using silicon dioxide as the masking material as set forth above, other dielectrics such as silicon monoxide or magnesium fluoride could be used. These two materials can both be applied by evaporating and condensing onto a hot substrate, about 350° C. for silicon.

While this invention has been described with reference to specific embodiments, this description is not to be construed in a limiting sense. Various modifications of the disclosed embodiments, as well as other embodiments of the invention, will now be apparent to persons skilled in the art, and so it is contemplated that the appended claims will cover any such modifications or embodiments as fall within the true scope of the invention.

What is claimed is:

1. A method of manufacturing a semiconductor device, comprising the steps of forming a first masking layer on and adhered to a surface of a semiconductor body, removing a portion of said first masking layer to form an opening exposing a limited area of said surface, epitaxially depositing a first semiconductor layer upon said surface in said opening, removing the masking layer, forming another masking layer over said first epitaxial deposited semiconductor layer, depositing a second epitaxial layer of high resistivity material around said first epitaxial layer, and forming a semiconductor device upon said second layer.

2. The method according to claim 1 wherein said semiconductor device formed upon said second semiconductor layer is formed by depositing another epitaxial layer over said second layer and diffusing impurity material into said another layer to form said device.

3. The method according to claim 1 wherein said first masking layer is silicon monoxide.

4. The method according to claim 1 wherein said first masking layer is magnesium fluoride.

5. The method according to claim 1 wherein said high resistivity epitaxial layer is composed of intrinsic appearing chromium doped gallium arsenide.

6. The method according to claim 1 wherein said surface of said body below said opening is P-type constituting one region of a diode and said first epitaxial layer interconnects said diode with said semiconductor device.

7. A method of manufacturing multi-layer semiconductor devices, comprising the steps of diffusing at least one region in a semiconductor substrate to form at least one semiconductor device, masking the surface of said substrate, removing a portion of said mask to expose a region of said semiconductor device, epitaxially depositing semiconductor material on the exposed region, removing said masking material, masking said epitaxial deposited material, epitaxially depositing high resistivity insulating material over unmasked portions of said substrate, removing the masking material from said epitaxial deposited material, epitaxially depositing a layer of semiconductor material over said first epitaxial deposited material and said high resistivity insulating material, and forming at least one semiconductor device in said epitaxial layer covering said insulating layer, said first deposited epitaxial material interconnecting said at least one semiconductor device in said substrate and at least one device formed in said epitaxially deposited layer of semiconductor material.

References Cited

UNITED STATES PATENTS

| | | | |
|---|---|---|---|
| 2,780,569 | 2/1957 | Hewlett | 148—174 |
| 2,983,631 | 5/1961 | Hanlet | 148—174 |
| 3,025,589 | 3/1962 | Hoerni | 148—175 |
| 3,098,774 | 7/1963 | Mark | 148—175 |
| 3,140,965 | 7/1964 | Reuschel | 148—175 |
| 3,156,591 | 10/1964 | Hale et al. | 148—175 |
| 3,189,973 | 6/1965 | Edwards et al. | 117—201 |
| 3,206,339 | 9/1965 | Thornton | 148—175 |
| 3,234,058 | 2/1966 | Marinace | 148—175 |
| 3,265,542 | 8/1966 | Hirshon | 148—175 |
| 3,296,040 | 1/1967 | Wigton | 148—175 |

OTHER REFERENCES

Armed Services Technical Information Agency, Report No. AD 282, 249, p. 30, Aug. 17, 1962.

Allen et al.: Metallurgy of Semiconductor Material, vol. 15, pp. 113–115, Aug. 30–Sept. 1, 1961.

L. DEWAYNE RUTLEDGE, *Primary Examiner.*

P. WEINSTEIN, *Assistant Examiner.*